United States Patent
Kohama et al.

(10) Patent No.: US 9,083,292 B2
(45) Date of Patent: Jul. 14, 2015

(54) ANALOG FEEDBACK AMPLIFIER

(75) Inventors: Tatsuo Kohama, Tokyo (JP); Kenichi Horiguchi, Tokyo (JP); Morishige Hieda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/236,196

(22) PCT Filed: Dec. 26, 2011

(86) PCT No.: PCT/JP2011/007268
§ 371 (c)(1),
(2), (4) Date: Jan. 30, 2014

(87) PCT Pub. No.: WO2013/098874
PCT Pub. Date: Jul. 4, 2013

(65) Prior Publication Data
US 2014/0300420 A1 Oct. 9, 2014

(51) Int. Cl.
*H03F 1/36* (2006.01)
*H03F 3/21* (2006.01)
*H03F 1/34* (2006.01)
*H03G 3/30* (2006.01)

(52) U.S. Cl.
CPC .. *H03F 3/21* (2013.01); *H03F 1/34* (2013.01); *H03G 3/3042* (2013.01); *H03F 2200/36* (2013.01); *H03F 2200/438* (2013.01)

(58) Field of Classification Search
CPC ......... H03F 1/36; H03F 3/21; H03F 2200/36; H03F 2200/438; H03G 3/3042
USPC ......................................... 330/107, 103, 109
See application file for complete search history.

(56) References Cited

U.S. PATENT DOCUMENTS

| | | | |
|---|---|---|---|
| 5,068,620 A * | 11/1991 | Botti et al. | 330/2 |
| 6,839,387 B1 | 1/2005 | Mittel | |
| 7,157,969 B2 * | 1/2007 | Candy | 330/251 |
| 7,345,540 B2 * | 3/2008 | Chang et al. | 330/207 A |
| 7,689,180 B2 * | 3/2010 | Grundlingh et al. | 455/126 |
| 8,258,863 B2 * | 9/2012 | Gupta et al. | 330/9 |
| 2007/0184791 A1 | 8/2007 | Vinayak et al. | |
| 2007/0184792 A1 | 8/2007 | Drogi et al. | |
| 2007/0184793 A1 | 8/2007 | Drogi et al. | |
| 2007/0184794 A1 | 8/2007 | Drogi et al. | |
| 2007/0184795 A1 | 8/2007 | Drogi et al. | |
| 2007/0184796 A1 | 8/2007 | Drogi et al. | |

(Continued)

FOREIGN PATENT DOCUMENTS

| | | |
|---|---|---|
| JP | 2006-174206 | 6/2006 |
| JP | 2009-81851 | 4/2009 |

(Continued)

OTHER PUBLICATIONS

International Search Report issued Jan. 24, 2012, in PCT/JP2011/007268, filed Dec. 26, 2011.

(Continued)

*Primary Examiner* — Henry Choe
(74) *Attorney, Agent, or Firm* — Oblon, McClelland, Maier & Neustadt, L.L.P.

(57) ABSTRACT

An analog feedback amplifier is capable of suppressing extraneous phase fluctuations and broadening a bandwidth by preventing effects of a group delay element by using an amplitude regulator 21 and a delay line 24.

7 Claims, 3 Drawing Sheets

(56) References Cited

U.S. PATENT DOCUMENTS

| | | |
|---|---|---|
| 2007/0218848 A1 | 9/2007 | Drogi et al. |
| 2009/0146736 A1 | 6/2009 | Kim et al. |
| 2010/0194440 A1 | 8/2010 | Drogi et al. |
| 2010/0201402 A1 | 8/2010 | Drogi et al. |
| 2010/0301934 A1 | 12/2010 | Drogi et al. |

FOREIGN PATENT DOCUMENTS

| | | |
|---|---|---|
| JP | 2009-525684 | 7/2009 |
| JP | 2010-518660 | 5/2010 |
| TW | 200618661 A | 6/2006 |
| WO | 2007/092195 A2 | 8/2007 |
| WO | 2008/078195 A2 | 7/2008 |

OTHER PUBLICATIONS

Peter B. Kenington, "High Linearity RF Amplifier Design", Artech House, Inc., 1984, pp. 164-169.

Combined Taiwanese Office Action and Search Report issued Feb. 24, 2014, in Taiwanese Patent Application No. 101104320 with English translation and with English translation of category of cited documents.

* cited by examiner

ANALOG FEEDBACK AMPLIFIER

TECHNICAL FIELD

The present invention relates to an analog feedback amplifier that can broaden its bandwidth by suppressing the effect of a group delay element due to a power amplifier.

BACKGROUND ART

As a conventional analog feedback amplifier, there is one which comprises an I-part comparator that takes the difference between the I-coordinate input signal of a baseband signal and a feedback signal, a Q-part comparator that takes the difference between the Q-coordinate input signal of the baseband signal and the feedback signal, a quadrature modulator that carries out quadrature modulation of the output signals of the IQ-part comparators and outputs an RF signal, a power amplifier that amplifies the RF output signal of the quadrature modulator, an attenuator that attenuates the RF output signal amplified by the power amplifier, and a quadrature demodulator that carries out quadrature demodulation of the RF output signal attenuated by the attenuator, supplies the I-coordinate signal of a baseband signal passing through the quadrature demodulation to the I-part comparator as the feedback signal, and supplies the Q-coordinate signal of the baseband signal passing through the quadrature demodulation to the Q-part comparator as the feedback signal (see the following Non-Patent Document 1).

In addition, as a conventional analog feedback amplifier, there is one which uses a polar coordinate system and performs an analog feedback in the same manner, and carries out band setting and follow-up control (see the following Patent Document 1).

PRIOR ART DOCUMENT

Patent Document

Patent Document 1: US Patent Application Publication No. US 2007/0184792 A1.

Non-Patent Document

Non-Patent Document 1: PETER B. KENINGTON, "HIGH-LINEARITY RF AMPLIFIER DESIGN" Artech House, Inc. pp. 164-169.

DISCLOSURE OF THE INVENTION

Problems to be Solved by the Invention

With the foregoing configurations, the conventional analog feedback amplifiers include a group delay element of the power amplifier in the feedback loop. Accordingly, they have a problem of phase fluctuates and of being it difficult to broaden its bandwidth.

The present invention is implemented to solve the foregoing problems. Therefore it is an object of the present invention to provide an analog feedback amplifier capable of suppressing extraneous phase fluctuations and broadening the bandwidth even if the feedback loop includes the group delay element.

Means for Solving the Problems

An analog feedback amplifier in accordance with the present invention comprises: a first comparator unit that takes the difference between an input signal and a first feedback signal; a second comparator unit that takes the difference between an output signal of the first comparator unit and a second feedback signal; a power amplifier unit that amplifies an output signal of the second comparator unit; a first amplitude regulator unit that regulates amplitude of an output signal of the power amplifier unit; a second amplitude regulator unit that regulates amplitude of the output signal of the second comparator unit and supplies a signal passing through the amplitude regulation to the second comparator unit as the second feedback signal; a delay unit that delays the output signal of the second amplitude regulator unit; and a third comparator unit that takes the difference between an output signal of the first amplitude regulator unit and an output signal of the delay unit, and supplies the differential signal to the first comparator unit as the first feedback signal.

Advantages of the Invention

According to the present invention, even if the feedback loop includes the group delay element due to the power amplifier unit, the second amplitude regulator unit and the delay unit control the amplitude and the delay, thereby being able to prevent the effects of the group delay element. This offers an advantage of being able to obtain an analog feedback amplifier capable of suppressing extraneous phase fluctuations and broadening the bandwidth.

BEST MODE FOR CARRYING OUT THE INVENTION

The best mode for carrying out the invention will now be described with reference to the accompanying drawings to explain the present invention in more detail.

Embodiment 1

Figure 1:
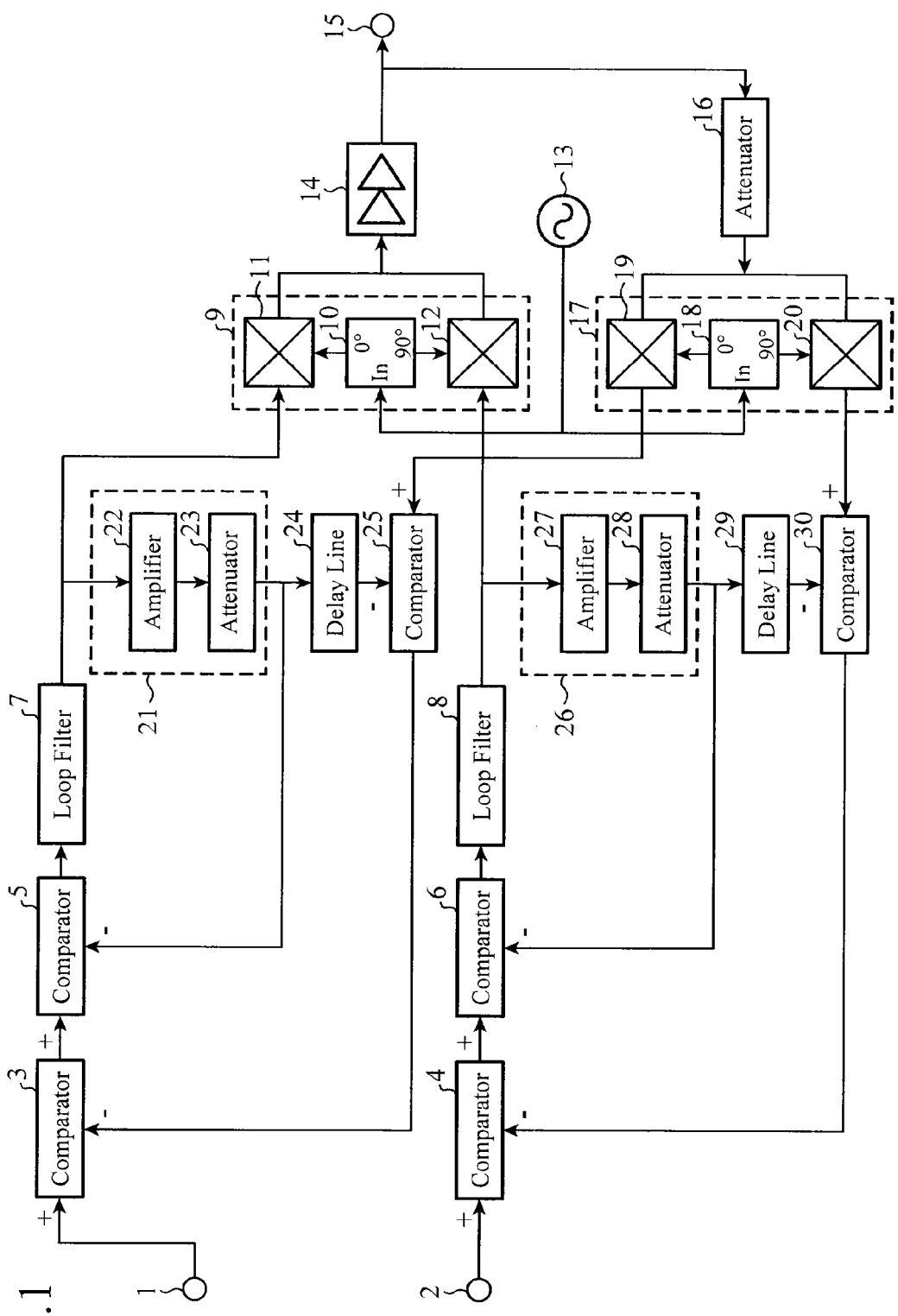
FIG. 1 is a block diagram showing a configuration of an analog feedback amplifier of an embodiment 1 in accordance with the present invention.

FIG. 1 is a block diagram showing a configuration of an analog feedback amplifier of an embodiment 1 in accordance with the present invention.

In FIG. 1, a comparator 3 takes the difference between the I-coordinate input signal of a baseband signal fed from an input terminal 1 and a feedback signal fed from a comparator 25 which will be described later.

A comparator 4 takes the difference between the Q-coordinate input signal of a baseband signal fed from an input terminal 2 and a feedback signal fed from a comparator 30 which will be described later.

A comparator 5 takes the difference between the output signal of the comparator 3 and a feedback signal fed from an amplitude regulator 21 which will be described later.

A comparator 6 takes the difference between the output signal of the comparator 4 and a feedback signal fed from an amplitude regulator 26 which will be described later.

A loop filter 7 passes only a low-frequency band of the output signal of the comparator 5.

A loop filter 8 passes only a low-frequency band of the output signal of the comparator 6.

A quadrature modulator 9 comprises a phase shifter 10 and multipliers 11 and 12, causes the phase shifter 10 to shift the phase of the RF signal fed from an oscillator 13 to 0 degree and 90 degrees, causes the multiplier 11 to multiply the output signal of the loop filter 7 by the 0-degree-phase-shifted RF signal, and causes the multiplier 12 to multiply the output signal of the loop filter 8 by the 90-degree-phase-shifted RF signal, thereby carrying out quadrature modulation.

A power amplifier 14 amplifies the RF output signal from the quadrature modulator 9, and outputs via an output terminal 15.

An attenuator 16 attenuates the RF output signal which undergoes amplification by the power amplifier 14 and is then branched.

A quadrature demodulator 17 comprises a phase shifter 18 and multipliers 19 and 20, causes the phase shifter 18 to shift the phase of the RF signal fed from the oscillator 13 to 0 degree and 90 degrees, causes the multiplier 19 to multiply the output signal of the attenuator 16 by the 0-degree-phase-shifted RF signal, and causes the multiplier 20 to multiply the output signal of the attenuator 16 by the 90-degree-phase-shifted RF signal, thereby carrying out quadrature demodulation.

An amplitude regulator 21 comprises an amplifier 22 and an attenuator 23, regulates the amplitude of the output signal from the loop filter 7, and supplies the signal passing through the amplitude regulation to the comparator 5 as the feedback signal.

A delay line 24 delays the output signal of the amplitude regulator 21.

The comparator 25 takes the difference between the I-coordinate signal passing through the quadrature demodulation by the quadrature demodulator 17 and the output signal of the delay line 24, and supplies the differential signal to the comparator 3 as the feedback signal.

An amplitude regulator 26 comprises an amplifier 27 and an attenuator 28, regulates the amplitude of the output signal of the loop filter 8, and supplies the signal passing through the amplitude regulation to the comparator 6 as the feedback signal.

A delay line 29 delays the output signal of the amplitude regulator 26.

A comparator 30 takes the difference between the Q-coordinate signal passing through the quadrature demodulation by the quadrature demodulator 17 and the output signal of the delay line 29, and supplies the differential signal to the comparator 4 as the feedback signal.

Next, the operation will be described.

In FIG. 1, the I-coordinate input signal of the baseband signal input via the input terminal 1 is supplied to the quadrature modulator 9 via the comparators 3 and 5 and the loop filter 7.

Likewise, the Q-coordinate input signal of the baseband signal input via the input terminal 2 is supplied to the quadrature modulator 9 via the comparators 4 and 6 and the loop filter 8.

The I-coordinate input signal passing through the loop filter 7 and the Q-coordinate input signal passing through the loop filter 8 undergo quadrature modulation by the quadrature modulator 9, followed by amplification by the power amplifier 14 and by being output from the output terminal 15 as the RF output signal.

The RF output signal passing through the amplification by the power amplifier 14 and the branching is attenuated by the attenuator 16 and undergoes quadrature demodulation to the I-coordinate signal and Q-coordinate signal by the quadrature demodulator 17.

The I-coordinate signal undergoing the quadrature demodulation is compared with the I-coordinate input signal by the comparator 3 after passing through the comparator 25, and the Q-coordinate signal undergoing the quadrature demodulation is compared with the Q-coordinate input signal by the comparator 4 after passing through the comparator 30. Thus, the I-coordinate part and the Q-coordinate part form a first feedback loop, respectively, so as to carry out the band setting and follow-up control.

Here, since the first feedback loops each contain the group delay element of the power amplifier 14, the problem arises in that the phase fluctuates and that it becomes difficult to broaden the bandwidth. Next, a means of solving the problem will be described.

Incidentally, although only the I-coordinate part of the IQ-coordinate parts will be described to simplify the description, the Q-coordinate part can be described in the same manner.

In the present embodiment 1, inside the first feedback loop, a second feedback loop is formed which extends from the output of the loop filter 7 after the comparator 3 and passes through the amplitude regulator 21, delay line 24 and comparator 25.

In addition, another feedback is formed to the comparator 5 via the amplitude regulator 21.

On this occasion, the present embodiment forms the second feedback loop, and sets the amplitude of the amplitude regulator 21 and the delay of the delay line 24 so as to zero the difference between the two input signals to the comparator 25, thereby making it possible to cancel out the group delay element of the power amplifier 14 inside the first feedback loop so that the group delay element of the power amplifier 14 is removed to the outside of the first feedback loop.

This enables the group delay element of the power amplifier 14 to be handled equivalently as though it were placed outside the first feedback loop.

Incidentally, feeding back to the comparator 5 via the amplitude regulator 21 enables feeding back the signal without the group delay element instead of the signal fed back through the first feedback loop originally.

Accordingly, even if the first feedback loop contains the group delay element of the power amplifier 14, the present embodiment 1 can avoid the effects of the group delay element by forming the second feedback loop, thereby being able to suppress the extraneous phase fluctuations and to broaden the bandwidth.

According to the present embodiment 1, even if the first feedback loop contains the group delay element due to the power amplifier 14, it can circumvent the effects of the group delay element by adjusting the amplitude and delay with the amplitude regulators 21 and 26 and the delay lines 24 and 29, thereby being able to suppress extraneous phase fluctuations and to broaden the bandwidth.

Incidentally, as for the amplitude regulators 21 and 26, when the amplitude is less than 1, the present embodiment can achieve the same effect using only the amplifiers 22 and 27 without the attenuators 23 and 28, when the amplitude is greater than 1, it can achieve the same effect using only the attenuators 23 and 28 without the amplifiers 22 and 27, and when the amplitude is 1, it can achieve the same effect without the amplitude regulators 21 and 26.

In addition, as for the attenuator 16, when the amplitude is 1, it can be omitted, achieving the same effect.

Furthermore, as for the delay lines 24 and 29, a delay circuit comprising a lumped circuit such as an inductor and capacitor, and a semiconductor can achieve the same effect.

Moreover, as for the loop filters 7 and 8, they can achieve the same effect even if they have amplitude in a low-frequency band.

Embodiment 2

Figure 2:
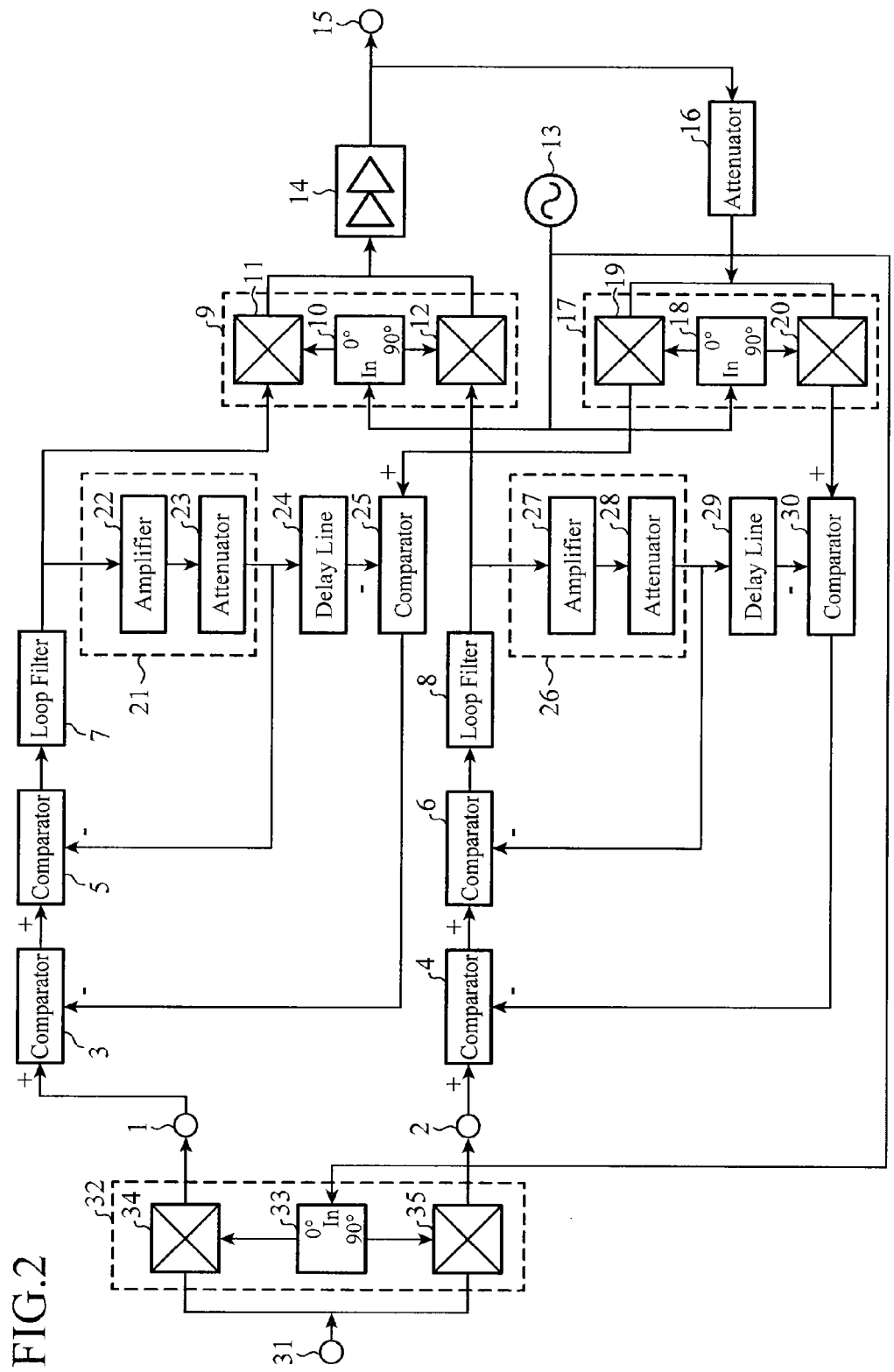
FIG. 2 is a block diagram showing a configuration of an analog feedback amplifier of an embodiment 2 in accordance with the present invention.

FIG. 2 is a block diagram showing a configuration of an analog feedback amplifier of an embodiment 2 in accordance with the present invention.

In FIG. 2, a quadrature demodulator 32 comprises a phase shifter 33 and multipliers 34 and 35.

It carries out quadrature demodulation by shifting the phase of the RF signal fed from the oscillator 13 to 0 degree and 90 degrees by the phase shifter 33, by multiplying the RF input signal fed from the input terminal 31 by the 0-degree-phase-shifted RF signal by the multiplier 34, and by multiplying the RF input signal fed from the input terminal 31 by the 90-degree-phase-shifted RF signal by the multiplier 35.

The I-coordinate input signal of the baseband signal undergoing the quadrature demodulation is supplied to the input terminal 1, and the Q-coordinate input signal of the baseband signal undergoing the quadrature demodulation is supplied to the input terminal 2, respectively.

As for the remaining configuration, since it is the same as that of FIG. 1, duplicate description thereof will be omitted.

According to the present embodiment 2, the quadrature demodulator 32 carries out quadrature demodulation of the RF input signal to the I-coordinate input signal and Q-coordinate input signal, and supplies the I-coordinate input signal to the input terminal 1 and the Q-coordinate input signal to the input terminal 2.

The configuration shown in the embodiment 2 can circumvent the effects of the group delay element by controlling the amplitude and delay with the amplitude regulators 21 and 26 and the delay lines 24 and 29, thereby being able to suppress extraneous phase fluctuations and to broaden the bandwidth.

Embodiment 3

Figure 3:
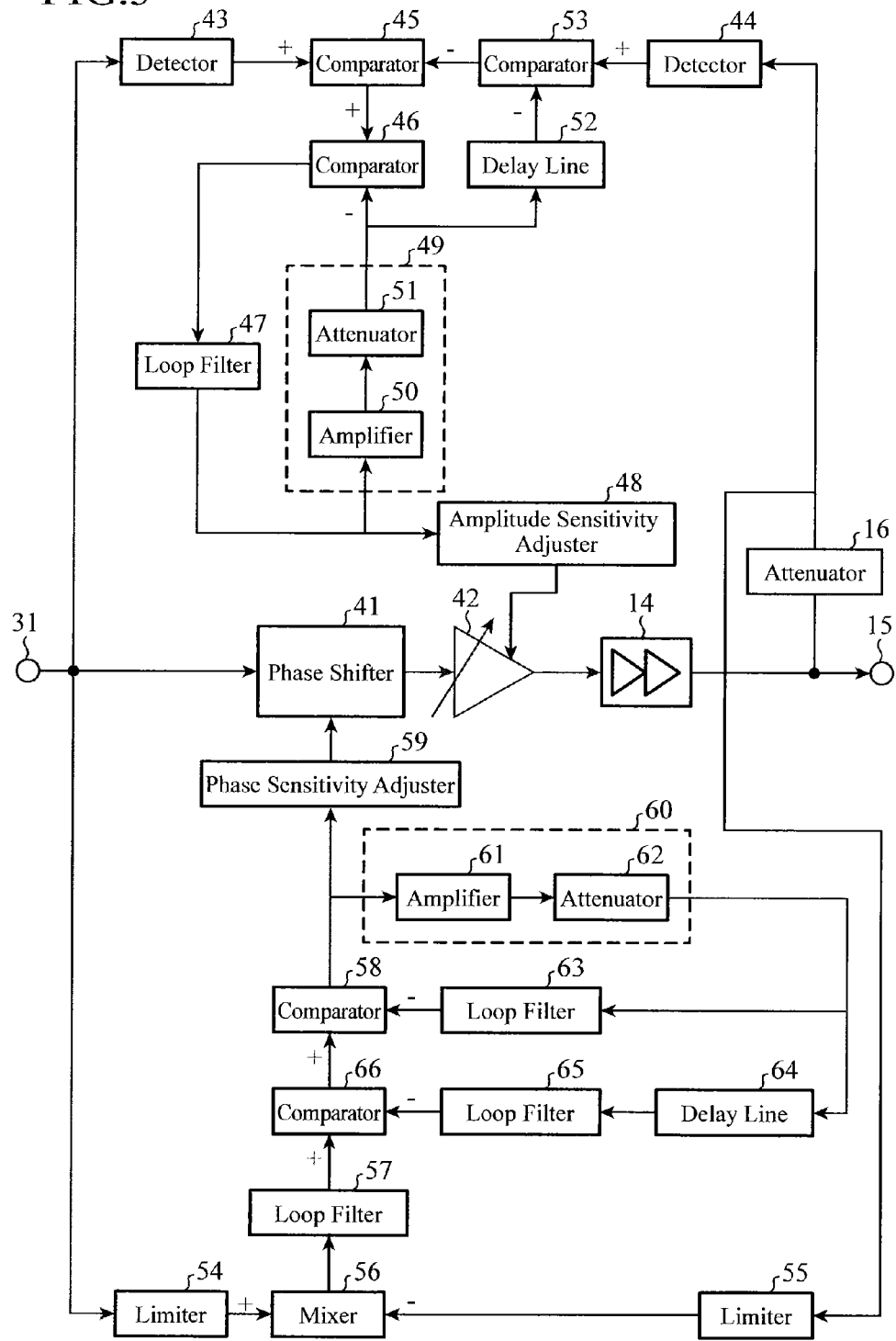
FIG. 3 is a block diagram showing a configuration of an analog feedback amplifier of an embodiment 3 in accordance with the present invention.

FIG. 3 is a block diagram showing a configuration of an analog feedback amplifier of an embodiment 3 in accordance with the present invention.

In FIG. 3, a phase shifter 41 shifts the phase of the RF input signal fed from the input terminal 31.

A variable gain amplifier 42 carries out variable gain amplification of the output signal of the phase shifter 41.

The power amplifier 14 amplifies the output signal of the variable gain amplifier 42, and outputs from the output terminal 15.

Incidentally, the phase shifter 41, variable gain amplifier 42 and power amplifier 14 constitute a phase shift amplifier unit.

A detector 43 detects the RF input signal.

A detector 44 detects the RF output signal attenuated by the attenuator 16.

A comparator 45 takes the difference between the output signal of the detector 43 and a feedback signal fed from a comparator 53 which will be described later.

A comparator 46 takes the difference between the output signal of the comparator 45 and a feedback signal from an amplitude regulator 49 which will be described later.

A loop filter 47 passes only a low-frequency band of the output signal of the comparator 46.

An amplitude sensitivity adjuster 48 controls the amplitude sensitivity of the variable gain amplifier 42 by controlling the rate of change of the output signal of the loop filter 47.

The amplitude regulator 49 comprises an amplifier 50 and an attenuator 51, regulates the amplitude of the output signal of the loop filter 47, and supplies the signal passing through the amplitude regulation to the comparator 46 as the feedback signal.

A delay line 52 delays the output signal of the amplitude regulator 49.

A comparator 53 takes the difference between the output signal of the detector 44 and the output signal of the delay line 52, and supplies the differential signal to the comparator 45 as the feedback signal.

A limiter 54 limits the RF input signal.

A limiter 55 limits the RF output signal attenuated through the attenuator 16.

A mixer 56 detects the phase difference between the output signals of the limiters 54 and 55, converts the phase difference into amplitude, and outputs it.

Incidentally, the limiters 54 and 55 and the mixer 56 constitute a phase difference detecting unit.

A loop filter 57 passes only a low-frequency band of the output signal of the mixer 56.

A comparator 58 takes the difference between the feedback signal fed from a comparator 66 which will be described later and the feedback signal fed from an amplitude regulator 60 which will be described later.

A phase sensitivity adjuster 59 controls the phase sensitivity of the phase shifter 41 by adjusting the rate of change of the output signal of the comparator 58.

The amplitude regulator 60 comprises an amplifier 61 and an attenuator 62, regulates the amplitude of the output signal of the comparator 58, and supplies the signal passing through the amplitude regulation to the comparator 58 via a loop filter 63 as the feedback signal.

Incidentally, the loop filter 63 passes only a low-frequency band of the feedback signal.

A delay line 64 delays the output signal of the amplitude regulator 60.

A loop filter 65 passes only a low-frequency band of the delayed output signal.

The comparator 66 takes the difference between the output signal of the loop filter 57 and the delayed output signal of the loop filter 65, and supplies the differential signal to the comparator 58 as the feedback signal.

Next, the operation will be described.

In FIG. 3, the RF input signal input via the input terminal 31 undergoes phase adjustment by the phase shifter 41, is further amplified by the variable gain amplifier 42 and the power amplifier 14, and is output from the output terminal 15 as the RF output signal.

As for the amplitude control by the variable gain amplifier 42, the comparator 45 compares the signal acquired by detecting the RF input signal by the detector 43 with the signal which is acquired by detecting the RF output signal passing through the attenuator 16 by the detector 44 and is supplied to the comparator 45 via the comparator 53. Furthermore, receiving the output signal of the comparator 45 via the loop filter 47, the amplitude sensitivity adjuster 48 controls the amplitude of the variable gain amplifier 42, thereby forming the first feedback loop and carrying out the band setting and follow-up control.

The present embodiment 3 has a second feedback loop formed inside the first feedback loop, which extends from the output of the loop filter 47 after the comparator 45 to the comparator 53 via the amplitude regulator 49 and delay line 52.

In addition, a feedback is formed to the comparator 46 via the amplitude regulator 49.

On this occasion, the present embodiment forms the second feedback loop, and sets the amplitude of the amplitude regulator 49 and the delay of the delay line 52 so as to zero the difference between the two input signals to the comparator 53, thereby making it possible to cancel out the group delay element of the power amplifier 14 inside the first feedback loop so that the group delay element of the power amplifier 14 is removed to the outside of the first feedback loop.

This enables the group delay element of the power amplifier 14 to be handled equivalently as though it were placed outside the first feedback loop.

Incidentally, feeding back to the comparator 46 via the amplitude regulator 49 enables feeding back the signal without the group delay element instead of the signal fed back through the first feedback loop originally.

In addition, as for the phase control by the phase shifter 41, the mixer 56 mixes the RF input signal undergoing the limitation by the limiter 54 with the RF output signal which passes through the attenuator 16 and undergoes the limitation by the limiter 55, converts to the amplitude corresponding to the phase difference of the output signals of the limiters 54 and 55, and outputs it. Furthermore, receiving the output signal of the mixer 56 via the loop filter 57, comparator 66 and comparator 58, the phase sensitivity adjuster 59 controls the phase of the phase shifter 41, thereby forming the third feedback loop and carrying out the band setting and follow-up control.

The present embodiment 3 forms inside the third feedback loop a fourth feedback loop which extends from the output of the comparator 58 after the loop filter 57 and passes through the amplitude regulator 60, delay line 64, loop filter 65 and comparator 66.

In addition, a feedback is made to the comparator 58 via the amplitude regulator 60 and loop filter 63.

On this occasion, the present embodiment forms the fourth feedback loop, and sets the amplitude of the amplitude regulator 60 and the delay of the delay line 64 so as to zero the difference between the two input signals to the comparator 66, thereby making it possible to cancel out the group delay element of the power amplifier 14 inside the third feedback loop so that the group delay element of the power amplifier 14 is removed to the outside of the third feedback loop.

This offers an advantage that the group delay element of the power amplifier 14 can be handled equivalently as though it were placed outside the third feedback loop.

Incidentally, feeding back to the comparator 58 via the amplitude regulator 60 and the loop filter 63 enables feeding back the signal without the group delay element instead of the signal fed back through the third feedback loop originally.

Accordingly, even if the first and third feedback loops include the group delay element of the power amplifier 14, the present embodiment 3 can prevent the effects of the group delay element by forming the second and fourth feedback loops, thereby being able to suppress extraneous phase fluctuations and to broaden the bandwidth.

According to the present embodiment 3, even if the first and third feedback loops include the group delay element due to the power amplifier 14, it can prevent the effects of the group delay element by controlling the amplitude and delay with the amplitude regulators 49 and 60 and the delay lines 52 and 64, thereby being able to suppress extraneous phase fluctuations and to broaden the bandwidth.

Incidentally, although the present embodiment detects the phase difference with the limiters 54 and 55 and the mixer 56, other configurations for detecting the phase difference have the same effects.

In addition, as for the amplitude regulators 49 and 60, when the amplitude is less than 1, the present embodiment can achieve the same effect using only the amplifiers 50 and 61 without the attenuators 51 and 62, when the amplitude is greater than 1, it can achieve the same effect using only the attenuators 51 and 62 without the amplifiers 50 and 61, and when the amplitude is 1, it can achieve the same effect without the amplitude regulators 49 and 60.

In addition, as for the attenuator 16, when the amplitude is 1, it can be omitted, achieving the same effect.

Furthermore, as for the delay lines 52 and 64, a delay circuit comprising a lumped circuit such as an inductor and capacitor, and a semiconductor can achieve the same effect.

Furthermore, although the embodiment 3 disposes the variable gain amplifier 42 after the phase shifter 41, the connection sequence can be altered, offering the same effect.

Furthermore, the loop filters 47, 57, 63 and 65 can achieve the same effect even if they have amplitude in a low-frequency band.

Incidentally, it is to be understood that a free combination of the individual embodiments, variations of any components of the individual embodiments or removal of any components of the individual embodiments are possible within the scope of the present invention.

INDUSTRIAL APPLICABILITY

As described above, an analog feedback amplifier in accordance with the present invention is configured in such a manner that even if the feedback loop includes the group delay element due to the power amplifier, it can prevent the effects of the group delay element by controlling the amplitude and delay with the amplitude regulator and delay line. Accordingly, it is suitable for an application to an amplifier that requires to suppress extraneous phase fluctuations and to broaden the bandwidth.

DESCRIPTION OF REFERENCE SYMBOLS 1, 2, 31 input terminal; 3-6, 25, 30, 45, 46, 53, 58, 66 comparator; 7, 8, 47, 57, 63, 65 loop filter; 9 quadrature modulator; 10, 18, 33, 41 phase shifter; 11, 12, 19, 20, 34, 35 multiplier; 13 oscillator; 14 power amplifier; 15 output terminal; 16 attenuator; 17, 32 quadrature demodulator; 21, 26, 49, 60 amplitude regulator; 22, 27, 50, 61 amplifier; 23, 28, 51, 62 attenuator; 24, 29, 52, 64 delay line; 42 variable gain amplifier; 43, 44 detector; 48 amplitude sensitivity adjuster; 54, 55 limiter; 56 mixer; 59 phase sensitivity adjuster.

What is claimed is:
1. An analog feedback amplifier comprising:
a first comparator unit that takes the difference between an input signal and a first feedback signal;
a second comparator unit that takes the difference between an output signal of the first comparator unit and a second feedback signal;
a power amplifier unit that amplifies an output signal of the second comparator unit;
a first amplitude regulator unit that regulates amplitude of an output signal of the power amplifier unit;
a second amplitude regulator unit that regulates amplitude of the output signal of the second comparator unit and supplies a signal passing through the amplitude regulation to the second comparator unit as the second feedback signal;

a delay unit that delays the output signal of the second amplitude regulator unit; and a third comparator unit that takes the difference between an output signal of the first amplitude regulator unit and an output signal of the delay unit, and supplies the differential signal to the first comparator unit as the first feedback signal.

2. The analog feedback amplifier according to claim 1, wherein the second amplitude regulator unit and the delay unit carry out amplitude control and delay control, respectively, so as to zero the difference taken by the third comparator unit.

3. An analog feedback amplifier comprising:

a first comparator unit that takes the difference between an I-coordinate input signal of a baseband signal and a first feedback signal;

a second comparator unit that takes the difference between an output signal of the first comparator unit and a second feedback signal;

a third comparator unit that takes the difference between a Q-coordinate input signal of the baseband signal and a third feedback signal;

a fourth comparator unit that takes the difference between an output signal of the third comparator unit and a fourth feedback signal;

a quadrature modulation unit that carries out quadrature modulation of output signals of the second comparator unit and of the fourth comparator unit and outputs an RF signal;

a power amplifier unit that amplifies the RF output signal of the quadrature modulation unit;

a first amplitude regulator unit that regulates amplitude of the RF output signal amplified by the power amplifier unit;

a quadrature demodulation unit that carries out quadrature demodulation of the RF output signal undergoing regulation of the first amplitude regulator unit, and outputs an I-coordinate signal and a Q-coordinate signal of the baseband signal;

a second amplitude regulator unit that regulates amplitude of the output signal of the second comparator unit, and supplies a signal passing through the amplitude regulation to the second comparator unit as the second feedback signal;

a first delay unit that delays the output signal of the second amplitude regulator unit;

a fifth comparator unit that takes the difference between the I-coordinate signal undergoing the quadrature demodulation by the quadrature demodulation unit and an output signal of the first delay unit, and supplies the differential signal to the first comparator unit as the first feedback signal;

a third amplitude regulator unit that regulates amplitude of the output signal of the fourth comparator unit, and supplies the signal passing through the amplitude regulation to the fourth comparator unit as the fourth feedback signal;

a second delay unit that delays the output signal of the third amplitude regulator unit; and a sixth comparator unit that takes the difference between the Q-coordinate signal undergoing the quadrature demodulation by the quadrature demodulation unit and an output signal of the second delay unit, and supplies the differential signal to the third comparator unit as the third feedback signal.

4. The analog feedback amplifier according to claim 3, wherein the second amplitude regulator unit and the first delay unit carry out amplitude control and delay control, respectively, so as to zero the difference taken by the fifth comparator unit; and the third amplitude regulator unit and the second delay unit carry out amplitude control and delay control, respectively, so as to zero the difference taken by the sixth comparator unit.

5. The analog feedback amplifier according to claim 3, further comprising:

a second quadrature demodulation unit that carries out quadrature demodulation of the RF input signal, supplies an I-coordinate signal of the baseband signal to the first comparator unit, and supplies a Q-coordinate signal of the baseband signal to the third comparator unit.

6. An analog feedback amplifier comprising:

a phase shift amplifier unit which includes a phase shifter unit that shifts a phase of an input signal, a variable gain amplifier unit that carries out variable gain amplification of the input signal, and a power amplifier unit that amplifies the input signal, in which the phase shifter unit, the variable gain amplifier unit and the power amplifier unit are connected in series in this order, or the variable gain amplifier unit, the phase shifter unit and the power amplifier unit are connected in this order;

a first comparator unit that takes the difference between the input signal to the phase shift amplifier unit and a first feedback signal;

a second comparator unit that takes the difference between an output signal of the first comparator unit and a second feedback signal, and varies gain of the variable gain amplifier unit by using an output signal of the second comparator unit corresponding to the differential signal;

a first amplitude regulator unit that regulates amplitude of an output signal of the phase shift amplifier unit;

a second amplitude regulator unit that regulates amplitude of the output signal of the second comparator unit, and supplies a signal passing through the amplitude regulation to the second comparator unit as the second feedback signal;

a first delay unit that delays the output signal of the second amplitude regulator unit;

a third comparator unit that takes the difference between the output signal of the first amplitude regulator unit and an output signal of the first delay unit, and supplies the differential signal to the first comparator unit as the first feedback signal;

a phase difference detecting unit that converts to amplitude a phase difference between the input signal to the phase shift amplifier unit and the output signal of the first amplitude regulator unit, and outputs the amplitude;

a fourth comparator unit that takes the difference between the output signal of the phase difference detecting unit and a delayed output signal;

a fifth comparator unit that takes the difference between an output signal of the fourth comparator unit and a third feedback signal, and controls a phase shift amount of the phase shifter unit by using an output signal of the fifth comparator unit corresponding to the differential signal;

a third amplitude regulator unit that regulates amplitude of the output signal of the fifth comparator unit, and supplies the signal passing through the amplitude regulation to the fifth comparator unit as the third feedback signal; and a second delay unit that delays the output signal of the third amplitude regulator unit, and supplies the delayed output signal to the fourth comparator unit.

7. The analog feedback amplifier according to claim 6, wherein the second amplitude regulator unit carries out its amplitude control and the first delay unit carries out its delay control so as to zero the difference taken by the third comparator unit; and the third amplitude regulator unit carries out its amplitude control and the second delay unit carries out its delay control so as to zero the difference taken by the fourth comparator unit.

* * * * *